(12) United States Patent
Hummerston et al.

(10) Patent No.: US 10,110,206 B2
(45) Date of Patent: Oct. 23, 2018

(54) VOLTAGE CONTROLLED CURRENT PATH, A VOLTAGE CLAMP, AND AN ELECTRONIC COMPONENT INCLUDING A VOLTAGE CLAMP

(71) Applicant: Analog Devices Global, Hamilton (BM)

(72) Inventors: Derek J. Hummerston, Hungerford (GB); Christopher Peter Hurrell, Cookham (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/713,538

(22) Filed: May 15, 2015

(65) Prior Publication Data

US 2016/0336931 A1 Nov. 17, 2016

(51) Int. Cl.
*H02H 9/04* (2006.01)
*H03K 5/08* (2006.01)

(52) U.S. Cl.
CPC .......... *H03K 5/08* (2013.01); *H02H 9/04* (2013.01); *H02H 9/041* (2013.01)

(58) Field of Classification Search
CPC ............ H02H 9/041; H02H 9/04; H03K 5/08
See application file for complete search history.

(56) References Cited

U.S. PATENT DOCUMENTS

| 7,116,140 B2* | 10/2006 | Koch | H03K 17/302 327/143 |
|---|---|---|---|
| 7,760,476 B2* | 7/2010 | Riviere | H01L 27/0285 361/56 |
| 8,400,742 B2* | 3/2013 | Lai | H02H 9/044 361/111 |
| 9,224,726 B2* | 12/2015 | Pardoen | H01L 27/0251 |
| 9,319,011 B2* | 4/2016 | Kinyua | H03F 3/2178 |
| 2003/0071767 A1* | 4/2003 | Park | G09G 5/006 345/42 |
| 2004/0080880 A1 | 4/2004 | Yang et al. | |
| 2010/0264976 A1* | 10/2010 | Duby | H03K 5/08 327/333 |
| 2010/0277841 A1 | 11/2010 | Riviere et al. | |
| 2010/0328827 A1 | 12/2010 | Lai et al. | |

(Continued)

FOREIGN PATENT DOCUMENTS

CN 106155174 A 11/2016

OTHER PUBLICATIONS

"Chinese Application Serial No. 201610105879.5, Office Action dated Mar. 29, 2017", (w/ English Translation), 15 pgs.

(Continued)

*Primary Examiner* — Zeev V Kitov
(74) *Attorney, Agent, or Firm* — Schwegman Lundberg & Woessner, P.A.

(57) ABSTRACT

According to a first aspect of this disclosure there is provided a voltage controlled current path. The voltage controlled current path comprises a first stage arranged to conduct current once the voltage at an input node of the first stage exceeds a threshold value. The amount of current that passes through the first stage is a function of the voltage at the input node. A second stage is arranged to pass a current that is a function of the current passing through the first stage.

31 Claims, 11 Drawing Sheets

(56) References Cited

U.S. PATENT DOCUMENTS

2011/0058293 A1    3/2011  Pardoen et al.
2012/0033335 A1*  2/2012  Wang ..................... H01L 23/60
                                                                   361/56

OTHER PUBLICATIONS

"Chinese Application Serial No. 201610105879.5, Office Action dated Dec. 5, 2017", 3 pgs.
"German Application Serial No. 102016108842.0, Office Action dated Jun. 21, 2018", w/ English Translation, 11 pgs.
"Patent Application No. 102016108842.0 Office Action dated Jun. 21, 2018", w/English Translation, (dated Jun. 21, 2018), 16 pages.

* cited by examiner

VOLTAGE CONTROLLED CURRENT PATH, A VOLTAGE CLAMP, AND AN ELECTRONIC COMPONENT INCLUDING A VOLTAGE CLAMP

FIELD

The present disclosure relates to a voltage controlled current path and to a voltage clamp including such a voltage controlled current path.

BACKGROUND

Some circuit components may only be able to tolerate voltages within a first voltage range, but may be driven by components whose power supply rails operate in a second voltage range which is bigger than the first voltage range and sufficiently large to damage the more delicate components. This disclosure teaches means for conducting current away from a node once a voltage at that node reaches a threshold value, thereby giving rise to the possibility of clamping the voltage at that node and thereby protecting components attached to that node.

SUMMARY

According to a first aspect of this disclosure there is provided a voltage controlled current path. The voltage controlled current path comprises a first stage arranged to conduct current once the voltage at an input node of the first stage exceeds a threshold value. The amount of current that passes through the first stage is a function of the voltage at the input node. A second stage is arranged to pass a current that is a function of the current passing through the first stage.

Advantageously the second stage has a first second stage node connected to a node to be protected. Thus, once the first stage starts passing current, the second stage can be arranged to sink current from, or if appropriate provide current to, the node to be protected in order to provide a current path that acts to limit voltage excursions at the node to be protected.

In some embodiments the current in the second stage may be substantially linearly related to the current in the first stage. However this is not a limitation or requirement of this disclosure and other transfer functions may be invoked.

The input node of the first stage may be connected to the node to be protected. This connection may be made by way of a low resistance path (that is the resistance it tending towards zero Ohms) or it may be made by way of an intervening component fabricated to have a non-zero impedance.

According to a second aspect of the present disclosure there is provided a voltage clamp comprising a voltage controlled current path in accordance with a first aspect of this disclosure.

BRIEF DESCRIPTION OF THE DRAWINGS

Embodiments of the present disclosure will now be described by way of non-limiting example only, with reference to the accompanying drawings, in which.

DETAILED DESCRIPTION

Figure 1:
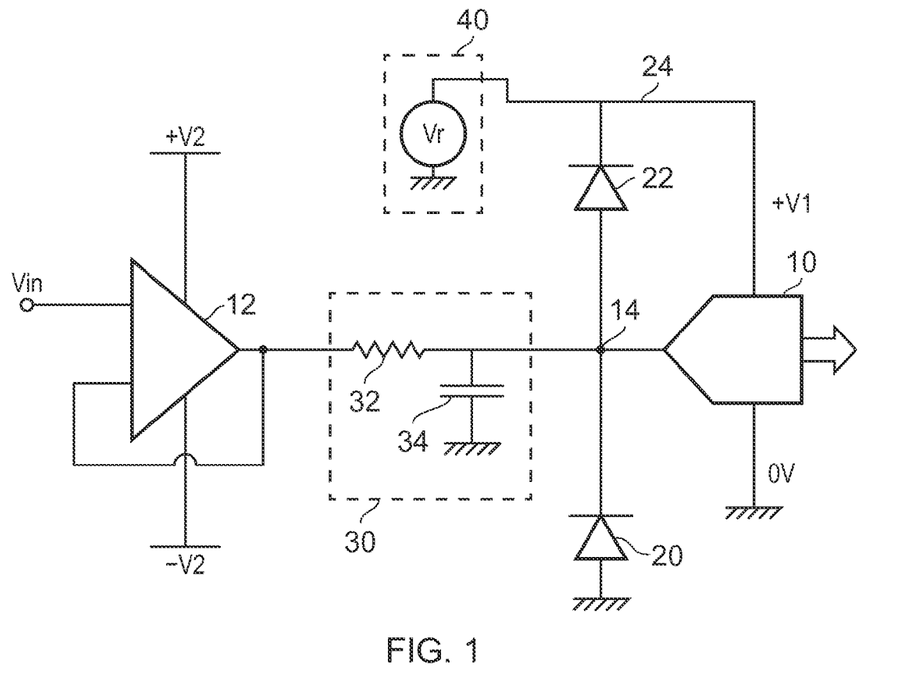
FIG. 1 is a circuit diagram of a first component, in this example an analog to digital converter, having its input connected to a node to be protected, and where a signal to the node to be protected is provided by a buffer operating over an extended voltage range.

FIG. 1 schematically illustrates a circuit in which a first device 10, in this non-limiting example an analog to digital converter, operating in a first voltage domain receives a signal from a second device 12, in this example an operational amplifier operating in a second voltage domain. The second voltage domain may be considerably bigger than the first voltage domain and can give rise to the possibility of the voltage at an intermediate node 14 becoming too high, or low, for the analog to digital converter 10. The voltage excursions at the node 14 might result in damage to the analog to digital converter 10. This might arise because the components of the analog to digital converter 10 have been fabricated using a low voltage process in order to obtain a small footprint on an integrated circuit and/or high speed.

The intermediate node, node 14, can be referred to as "a node to be protected" or a "protected node". These terms will be used interchangeably throughout this disclosure.

In normal operation the buffer 12 receives an input signal Vin which it supplies to the input of the analog to digital converter 10. Vin is constrained to lie within an appropriate voltage range. However, at circuit power up the power supply rails +V2 and −V2 of the second voltage domain may be established by power supplies which may include mechanical switches, or which may include switched mode components such as charge pumps or inductor based power supplies. As a result, upon switch on the power supplies +V2 and −V2 may transition towards their nominal voltages at different rates and following different voltage evolutions. Thus, for example, supply +V2 might become much more rapidly established than supply −V2. This could result in the buffer 12 allowing the voltage at its output node to rise excessively, and possibly rise all the way to +V2, before the circuitry of the buffer 12 establishes proper operation and starts to track the voltage Vin. As a result the voltage at the node to be protected 14 might rise to damagingly high levels which could adversely affect the operation of the analog to digital converter 10. High voltages might result in destruction of transistors or might result in charge being trapped within transistors thereby disrupting their correct operation until such time as the charge has leaked away.

As the node 14 represents an input to the analog to digital converter 10 it is commonplace to provide electrostatic discharge (ESD) and overvoltage/under voltage protection components. These may be a simple as provision of diodes 20 and 22 as shown in FIG. 1, or may be by way of provision of more complex transistor based circuits in order to provide fast response times and better control of trigger voltage and holding voltage characteristics for the node 14 compared to a local ground or zero volt supply.

In the arrangement shown in FIG. 1, the diode 20 extends between the node to be protected 14 and ground. In the event of an under voltage condition the diode 20 can switch on and conduct current to the node 14. Typically a filter 30 comprising resistor 32 connected in series between the node 14 and the output of the buffer 12 and a capacitor 34 between the node 14 and ground is provided in order to bandwidth limit noise occurring at the input of the analog to digital converter 10. The occurrence of the resistor 32 enables moderate current flow through the diode 20 to limit the voltage excursion at the node 14.

In the event of an overvoltage excursion then diode 22 becomes conducting. The diode 22 is often connected to a power supply rail 24 which is intended to provide a reference voltage, and possibly a current, to the analog to digital converter 10. However in its normal operation the voltage supply connected to supply rail 24 is not normally intended to sink current flowing from the buffer 12 through the resistor 32. The diode 22 may be connected to a voltage reference 40 which serves to provide a reference voltage Vr to the ADC 10.

Figure 2:
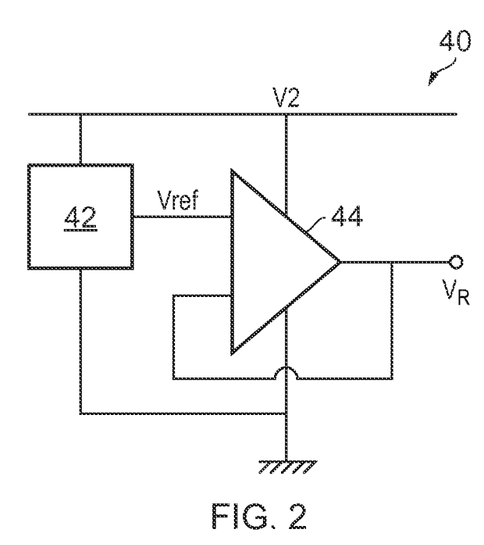
FIG. 2 is a circuit diagram of the reference voltage generator of FIG. 1.

FIG. 2 schematically illustrates the voltage reference 40 in greater detail. The voltage reference 40 typically comprises a precision voltage source 42 that generates a voltage Vref and a buffer 44 which ensures that negligible current is taken from the precision voltage reference 42. The buffer 44 typically only has to supply a moderate current to the ADC 10 and consequently the buffer 44 is often constructed so as to have a modest current flow therein. This reduces the overall power consumption of the circuit and also reduces the footprint of the buffer on a semiconductor wafer, and hence its effective cost. As a result the buffer 44 is often unable to pass the current from the diode 22 without the voltage $V_R$ at the output of the buffer 44 becoming perturbed.

The inventors felt it would be desirable to provide an alternative means to protect node 14 from overvoltage excursions such that in the event of an overvoltage excursion the diode 22 (if provided) would not conduct any significant amount of forward current and hence the operation of the buffer 44 would not be compromised.

Figure 3:
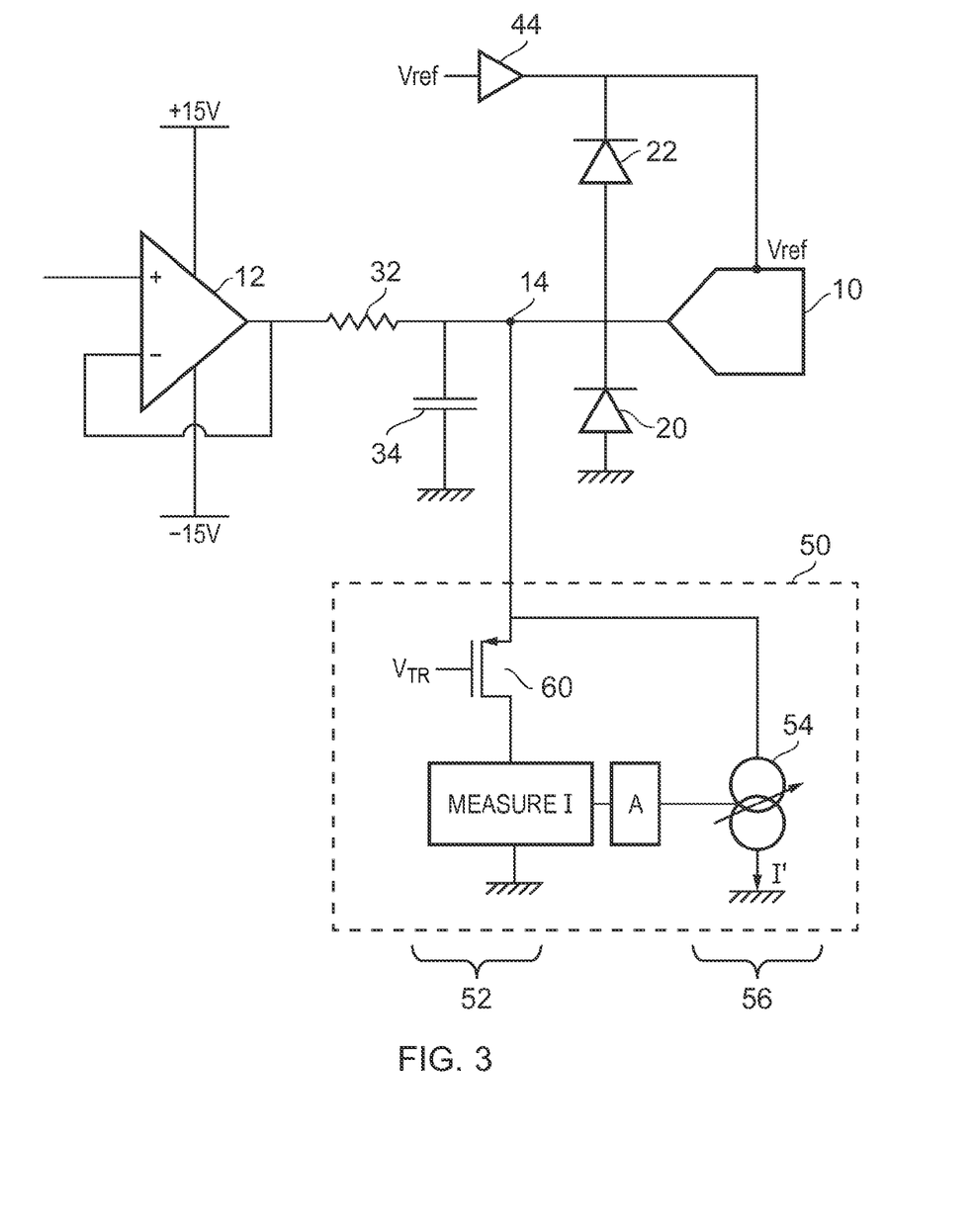
FIG. 3 is a circuit diagram of the arrangement of FIG. 1 in combination with a voltage controlled current flow path constituting an embodiment of the present disclosure.

FIG. 3 repeats the arrangement described with respect to FIG. 1, and an additional protection circuit 50 has been connected to the node to be protected 14 in order to provide a current path to ground (or if appropriate some other supply rail) in the event that the voltage at node 14 rises above a protection voltage $V_P$. The protection circuit comprises a first stage which acts to monitor the voltage at the node to be protected 14 and compare it with the trigger voltage $V_{TR}$. $V_{TR}$ may be set to cause the transistor to conduct a non-negligible current once $V_P$ is reached. If the voltage at node 14 exceeds the $V_{TR}$, and optionally a offset $V_T$, then a current starts to flow in the first stage 52. That current may be subjected to a gain A and used to control a current I' passed by a controllable current path 54 in a second stage of a protection circuit 50 so as to remove current from node 14 and to provide a path to ground. $V_{TR}$ may be the same as, or derived from, $V_R$.

The input stage 50 may comprise at least a first transistor 60 which, in this example, is a P-type field effect transistor. The transistor 60 may have a gate to source threshold voltage $V_T$ which may be needed to be reached before the transistor becomes significantly conducting. The effect of $V_T$ should be considered by the circuit designer when defining the trigger voltage $V_{TR}$ such that the circuit as a whole starts to pass current when the node 14 reaches a protection voltage $V_P$.

Figure 4:
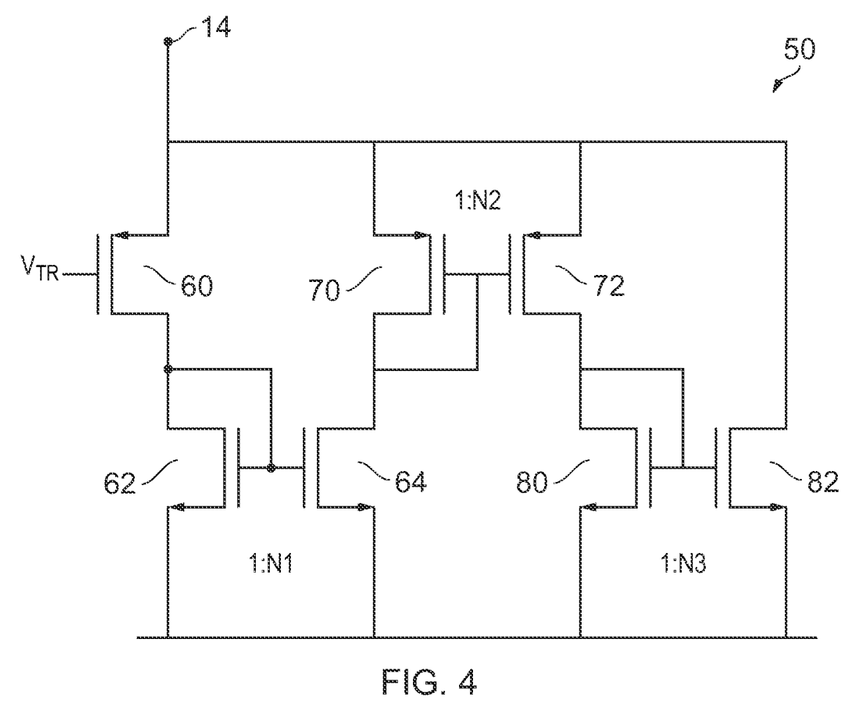
FIG. 4 is a circuit diagram of a voltage controlled current flow path constituting a first embodiment of this disclosure.

FIG. 4 illustrates a possible embodiment of the circuit 50 in greater detail. As discussed with respect to FIG. 3, the first transistor 60 remains substantially non-conducting until the voltage at node 14 hits a protection voltage $V_P$ where $V_P$ is controlled by the gate voltage $V_{TR}$ and the threshold voltage of the transistor 60. To a first approximation the current passing through the FET 60 is described by the following equation:

$$I_D \approx \mu_n C_{ox}(W/L)(V_{GS}-Vth)^2$$

Where: $I_D$=drain current, $\mu_n$=charge carrier mobility, $C_{ox}$=capacitance of oxide layer, W=gate width, L=gate length, $V_{GS}$=gate-source voltage and Vth=threshold voltage.

The current passing through the transistor 60 is provided to a diode connected N-type field effect transistor 62 which has its gate connected to field effect transistor 64 in order to form a current mirror. The transistor 64 is fabricated to be N1 times wider than the transistor 62 in order to provide a current mirror having a gain of 1 to N1. A drain of the transistor 64 is connected to the drain of a P-type field effect transistor 70 whose source is, in this example, connected to node 14. The transistor 70 is provided in diode connected configuration and its gate is connected to the gate of a further P-type field effect transistor 72. The transistor 72 is N2 times wider than the transistor 70 so as to form a second current mirror having a gain of 1 to N2. A drain of the P-type transistor 72 is connected to the drain of an N-type transistor which has its gate connected to its drain in order to place it in a diode connected configuration. The gate of the transistor 80 is also connected to the gate of a further N-type transistor 82 whose drain is connected to node 14 and whose source is connected to ground. Similarly the sources of the transistors 80, 64 and 62 are also connected to ground. Transistor 82 is fabricated to be N3 times wider than transistor 80 so as to form a current mirror having a gain of 1 to N3. As a result the current passing through transistor 82 is N1×N2×N3 times greater than the current flowing through the first transistor 60. Thus the circuit provides a relatively compact way of sinking large amounts of current from the node 14 without having to form phenomenally wide transistors as part of the current mirrors.

A particular advantage of the circuit shown in FIG. 4 is that it is "failsafe". Thus, if at a switch on event the voltage $V_{TR}$ does not get formed quickly and is close to zero for longer than expected, then the transistor 60 becomes conducting at a lower voltage than $V_P$. As a result the protection circuit still switches on, and switches on at a lower voltage than would normally be the case thereby continuing to protect the node 14 during the power-up phase of the circuitry of FIG. 3.

Figure 5:
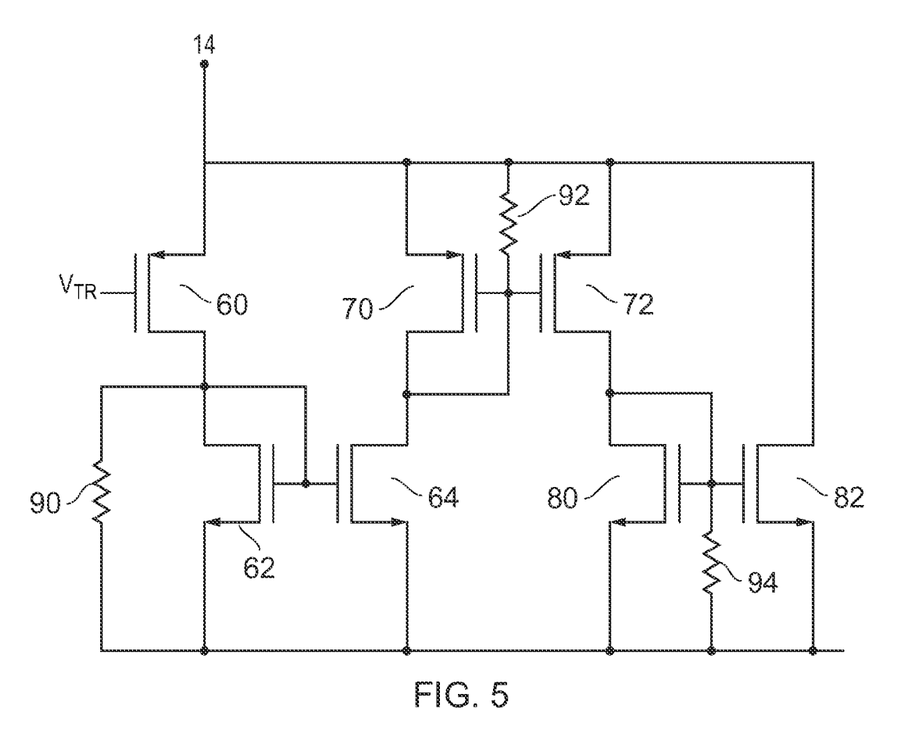
FIG. 5 shows a variation on the circuit of FIG. 4.

The circuit of FIG. 4 has the advantage that it turns on very quickly. However if the operation of the circuit of FIG. 3 is such that the buffer 12 went into an overvoltage state but then rapidly reestablished to normal operation and reduced its voltage very quickly then there is the possibility that the transistor 60 can switch off rapidly. During operation each of the transistors 62, 64 and so on have a parasitic gate capacitance. If transistor 60 switches off rapidly then the transistor 64 may remain conducting for a short time through charge stored on its parasitic gate capacitance until such time as that charge is discharged to ground by virtue of flowing through diode connected transistor 62. However the switch off times of the circuit can be improved by the provision of a bleed resistor 90 between the gate of the transistors 62 and 64 and ground, as shown in FIG. 5. An additional bleed resistor 92 may be connected between the gate of the transistor 72 and its source, and similarly a bleed resistor 94 may be connected between the gates of the transistors 80 and 82 on the ground. These components allow the transistors to transition to an off state more rapidly. Additionally or alternatively switches responsive to an activate/deactivate signal may be provided to inhibit current flow from the protected node 14 as will be described with respect to FIG. 9.

Figure 6:
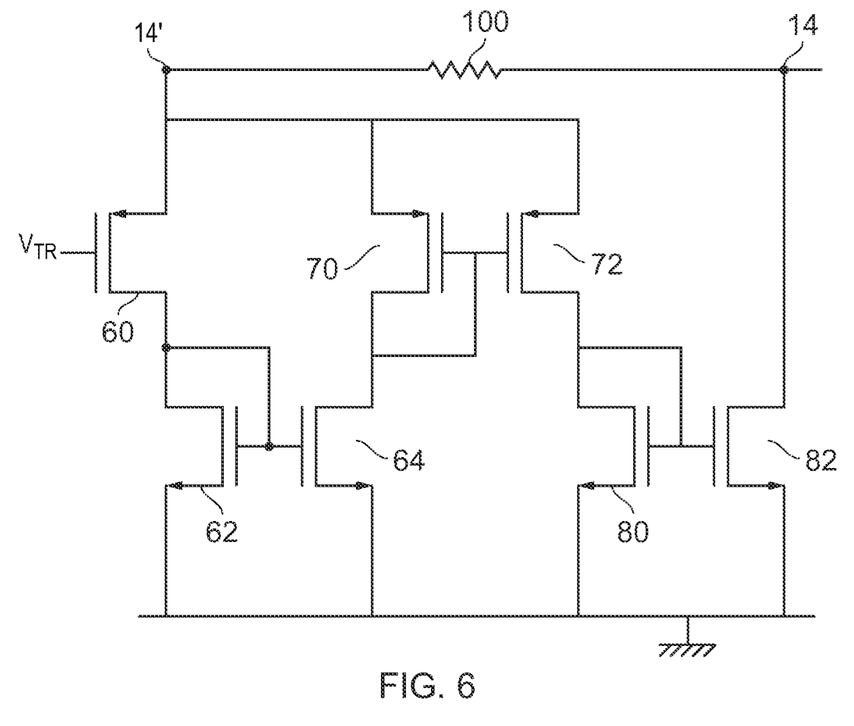
FIG. 6 shows an embodiment in which the first stage input node and a current flow path node are separated from one another by way of an additional impedance.

FIG. 6 shows the arrangement of FIG. 5 in a variation in which the drain of the final transistor 82 is connected to the protected node 14 and the drain of the first transistor 60 is connected to an intermediate node 14' separated from node 14 by a impedance, which in this instance is a resistor 100. The resistor 32 and resistor 100 may be provided in series such that voltage changes at node 14 as result of operation of the protection circuit 50 are attenuated at node 14', and are less likely to give rise to oscillatory behavior. FIG. 6 also serves to show that the node where the voltage is sensed and the node where the current is sunk from can be different nodes.

Figure 7:
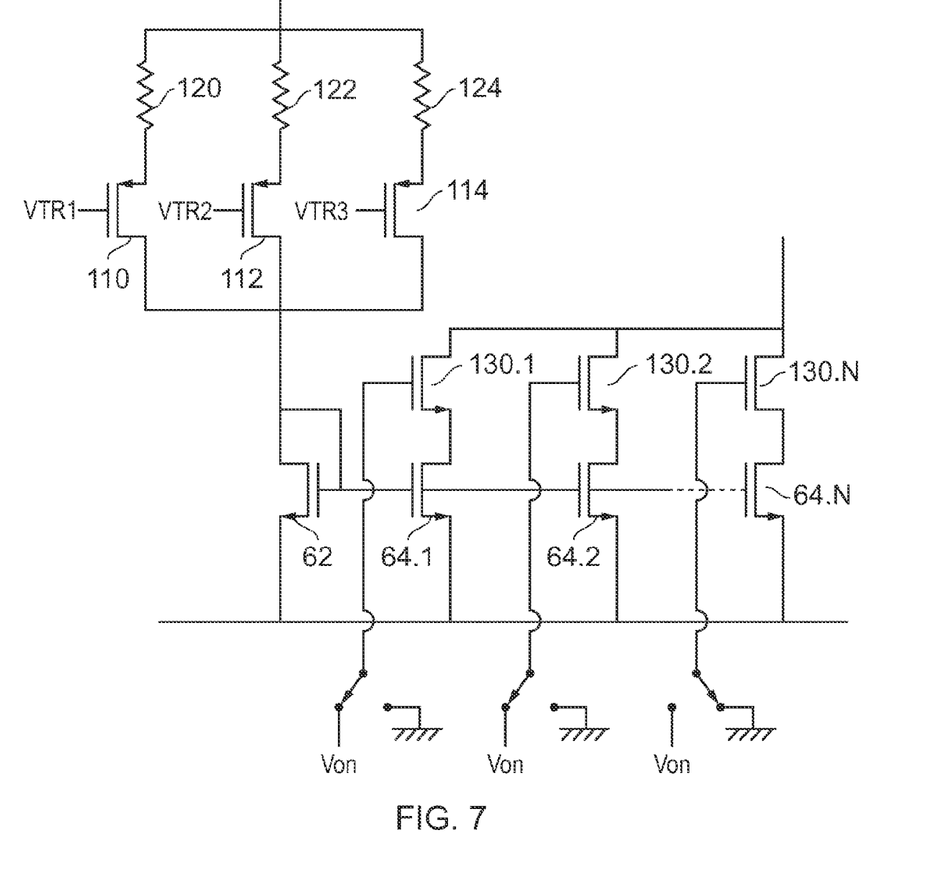
FIG. 7 illustrates two modifications, which may be applied independently, to the embodiments described hereinbefore.

It may be desirable to modify the switch on characteristic of the transistor 60 of the first stage by replacing that transistor by a plurality of transistors as shown in FIG. 7. The input stage transistors are now designated 110, 112 and 114. Although three transistors have been shown fewer or more transistors may be implemented. These transistors 110, 112 and 114 may be driven from a shared threshold voltage $V_{TR}$ or as shown may have individual threshold voltages $V_{TR1}$, $V_{TR2}$ and $V_{TR3}$ which may differ from each other by only a few millivolts but which serve to smooth the transition of the input stage between non-conducting and conducting. Furthermore the transistors may be associated with degeneration resistors 120, 122 and 124 which further modify the characteristic of the entire circuit.

Additionally or alternatively the gain of the current mirrors may be varied. One approach might be to short one of the current mirrors out, for example connecting the drain of transistor 64 to the drain of transistor 80 of FIG. 6 by a further transistor (not shown) which can be operated like a switch. However for a less abrupt and consequently more gradual approach the current mirror transistors may be divided into individual transistors here designated 64.1, 64.2 all the way up to 64.N. The transistors are arranged in parallel and their gates are tied together. In order for the current flow of each transistor to be allowed to contribute to the total current flow or to be switched out, further transistors 130.1, 130.2 and 130.N may be arranged in series connected configuration with the transistors 64.1, 64.2 up to 64.N. The transistor 130.1 can act as a switch to ether allow or inhibit current flow through the transistor 64.1. Similarly transistor 130.2 acts as a switch for transistor 64.2 and so on. Furthermore, when the transistors 130.1, 130.2 and so on are set to be conducting, they can be set to a reference voltage in order to act as a cascode transistor for the current mirrors 64.1, 64.2 and so on. This may further linearize the response of the circuit. In a further variation the "on" voltage provided to the gates of the cascode transistors may be caused to vary as a function of the current flow in the first stage thereby providing the possibility for non-linear transfer functions to be implemented.

The voltage threshold $V_{TR1}$, $V_{TR2}$ and $V_{TR3}$ may be varied under the control of an analog or digital controller so as to implement various control strategies, such as hysteresis, in order to inhibit oscillation.

Figure 8:
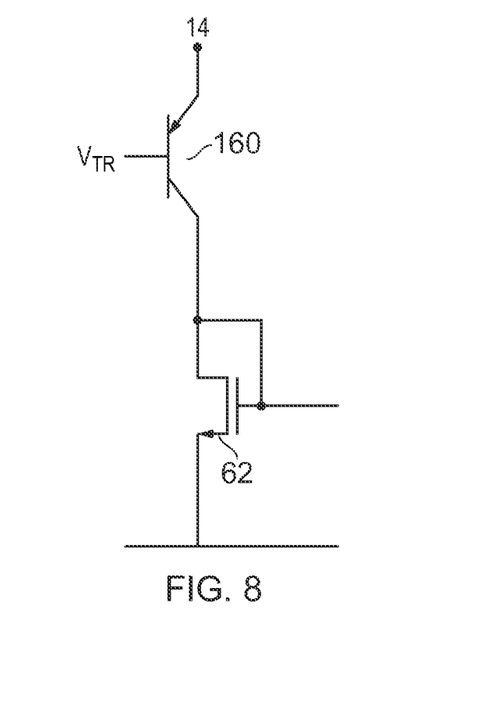
FIG. 8 shows a modification of the first stage where the first transistor is implemented in bipolar technology.

In embodiments described so far all of the transistors have been field effect transistors. However an equivalent circuit could be made using only bi-polar transistors or, as shown in FIG. 8 a mixture of technologies can be used. In FIG. 8 only the first stage is illustrated and the first transistor 60 has been replaced by a PNP bipolar transistor 160 having its base connected to receive the threshold voltage $V_{TR}$ and its emitter to node 14 (although it could also be attached to node 14').

Figure 9:
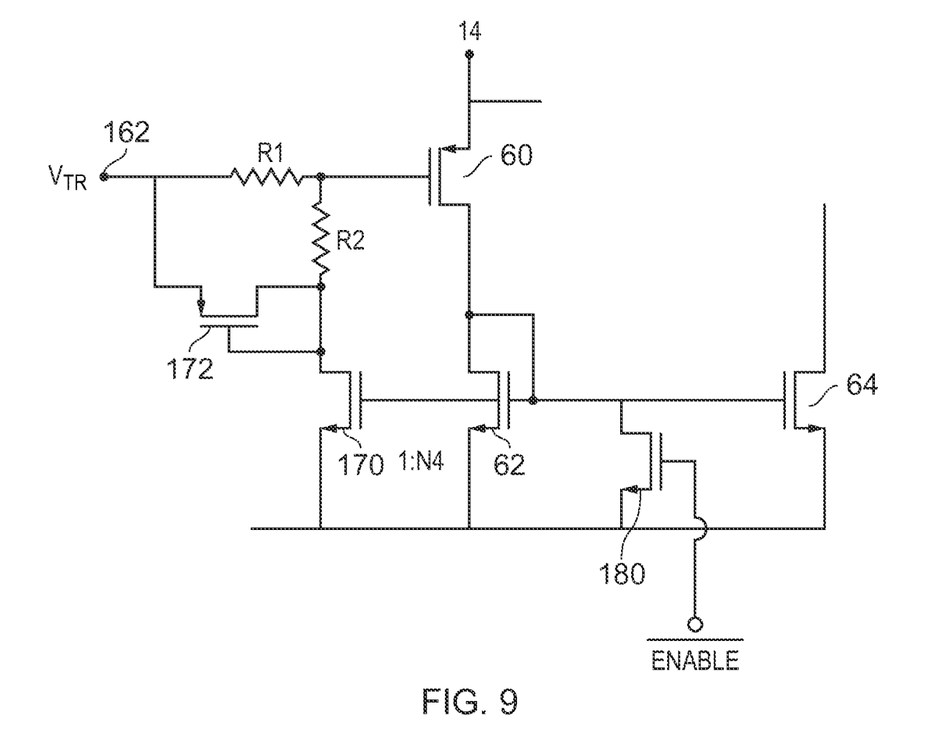
FIG. 9 shows a further modification to the first stage in order to add hysteresis.

FIG. 9 shows a further variation on the circuit on FIG. 4 where a resistor R1 is connected in series in the gate of the transistor 60 and an input node 162 to which the transistor control voltage $V_{TR}$ is applied. The second resistor R2 extends between the gate of the transistor 60 and ground by way of a further transistor 170 whose gate is coupled to the gate of the transistor 62. Thus transistor 170 passes a current which is proportional to the current flowing through transistor 60. The transistor 170 may have a different size to the transistor 62, for example it may be thinner such that it passes less current in a ratio of 1 to N4. Thus, when the protection circuit is not operative and the transistor 60 is not passing any current, then the full voltage $V_{TR}$ is applied to the gate of the transistor 60. If the voltage at node 14 rises transistor 60 starts to conduct. This in turn limits the voltage at node 14 and possibly could drag it below the protection voltage $V_P$. If the circuit were then to shut down then the voltage at node 14 could arise abruptly giving rise to an oscillatory condition. In order to reduce this problem, once transistor 60 begins to conduct the transistor 170 also begins to conduct. This allows current to flow through R2 thereby reducing the gate voltage of transistor 60 compared to control voltage $V_{TR}$. This now gives rise to hysteresis such that the threshold voltage to switch on and the threshold voltage to switch off as slightly different. Thus the risk of oscillatory behavior is reduced. A further transistor 172 may be provided as a diode connected P-type transistor either in parallel with R1 and R2 (as shown) or just in parallel with R1. When current flows in transistor 170 it also flows in transistor 172. In this configuration the gate of transistor 60 sees a divided down version of $V_{GS}$ of transistor 172, which for small current approximates $\alpha.V_T$ where $\alpha<1$. This provides improved tracking of $V_T$ with process and temperature variation.

It is thus possible to provide a voltage driven current pass which can be used in combination with a series impedance to clamp the voltage at a protected node such that it does not substantially move outside of a predefined operating range.

The circuit shown herein has been used to provide overvoltage protection. However the skilled person will appreciate that a suitable modification, generally swapping N-type devices for P-type devices and vice-versa, this configuration can also be used to provide under-voltage protection.

The circuits disclosed herein may also be digitally enabled and disabled. This can be done either by modifying the voltage $V_{TR}$ provided to the first transistor or, as shown in FIG. 9 a further transistor 180 may be provided in association with one of the current mirrors, such as the current mirror formed by transistor 62 and 64, so as to pull the gate voltage of the transistor 64 to ground, thereby switching it off. A similar approach could be achieved with the arrangement shown in FIG. 7 by switching all of the transistors 130.1 to 130.N to an off state.

Figure 10:
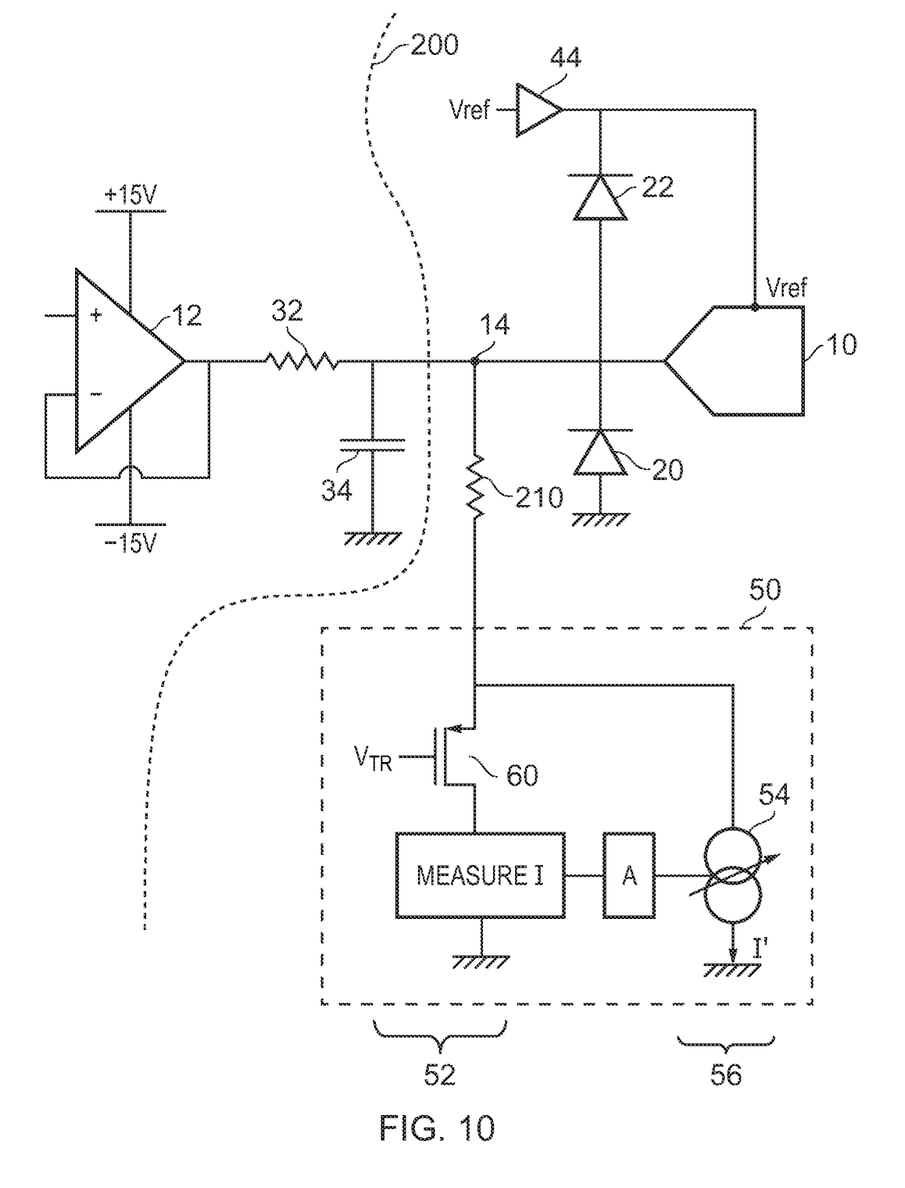
FIG. 10 shows a variation of the circuit shown in FIG. 3 so as to include Electrostatic discharge components in the current flow path to the voltage controlled current sink.

Node 14 may represent a chip or die boundary. In FIG. 10 the components to the left of dotted line 200 may be provided on, for example, a circuit board whereas the components to the right of dotted line 200 may be provided within an integrated circuit package. As such node 14 may be a node which may require protection from electrostatic discharge events. The diodes 20 and 22 may be closely associated with the ADC 10 and may be embedded with the ADC to such an extent that whilst the serve to protect the ADC 10 from ESD events, they do not serve to protect the transistors in the protection circuit 50. To address this the protection circuit 50 may be associated with its own ESD protection components. Such an arrangement is shown in FIG. 10 where an ESD protection component 210 is interposed in the current flow path between the protected node 14 and the protection circuit 50. In FIG. 10 the protection component is a resistor.

Figure 11:
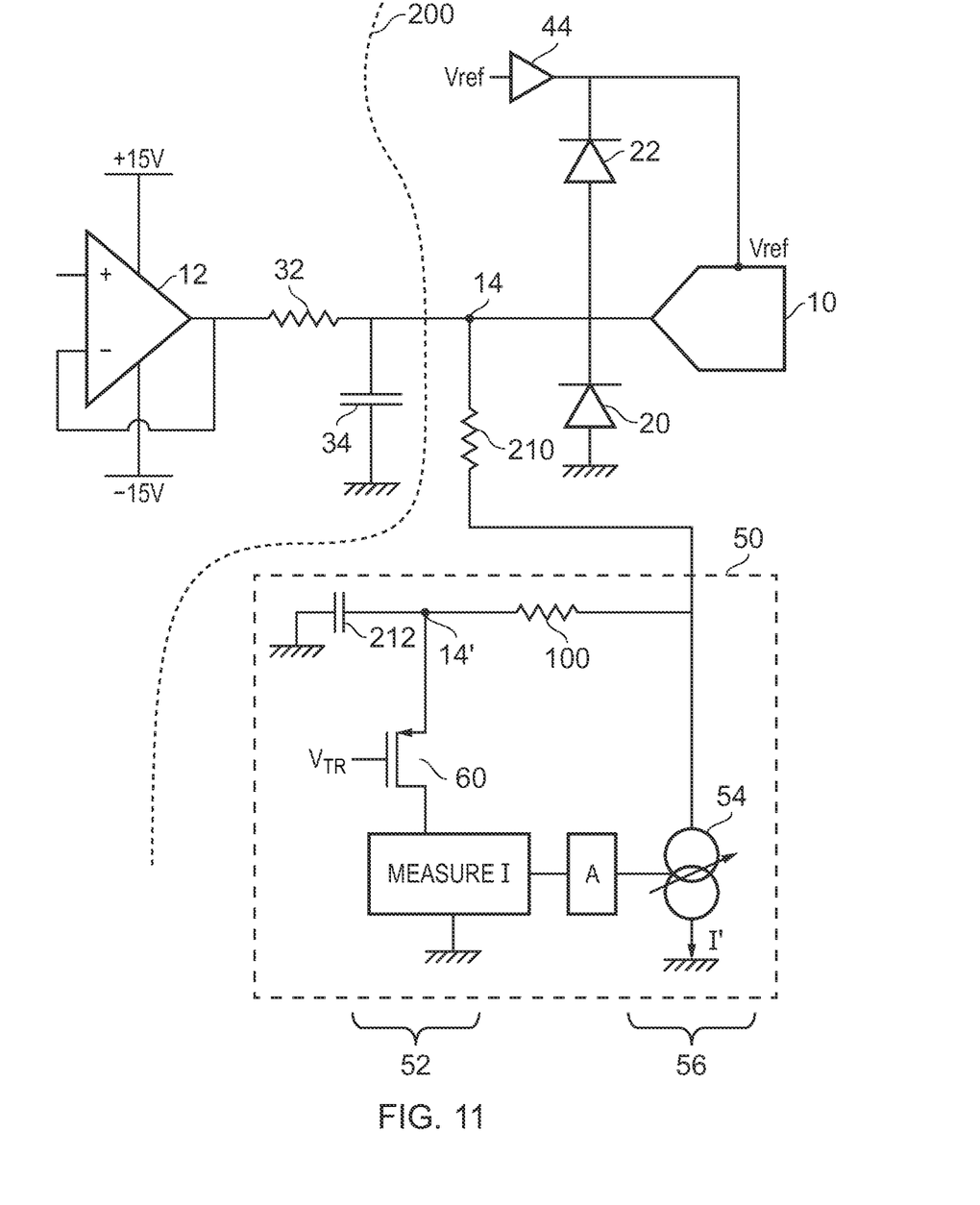
FIG. 11 shows a further variation of a circuit in accordance with this disclosure.

Earlier, with respect to FIG. 6, it was noted that the protection circuit 50 could have a second node 14' separated from node 14. Node 14' could be connected to the filter 30. However in a variation shown in FIG. 11, the node 14' is not directly in the signal path. This allows for the possibility of other components being attached to node 14' to modify the response of the protection circuit 50. For example a capacitor 212 could be connected to node 14' so as to modify the response of the protection circuit. This may be beneficial if the input stage is formed of a plurality of transistors as described with respect to FIG. 7, but where some of the input transistors have their sources connected to node 14 and some to node 14'. This allows a rapid turn on by those transistors connected to node 14 but a slower response from those transistors connected to node 14'. This may serve to dampen oscillatory behavior without sacrificing turn on time.

The claims presented herein are set out in single dependency format suitable for filing at the USPTO. However it should be appreciated that each claim may depend on any preceding claim of the same category, except where that is clearly infeasible.

What is claimed is:

1. A voltage controlled current path, comprising:
    a first stage arranged to conduct current when the voltage at an input node of the first stage exceeds a threshold value, wherein the amount of current is a first function of the voltage at the input node;
    a second stage arranged to pass a current as a second function of the current through the first stage;
    wherein the second stage includes at least one current mirror having a sense transistor and a mirror transistor; and
    wherein the second function is a function of a ratio of a width of the sense transistor and a width of the mirror transistor.

2. A voltage controlled current path as claimed in claim 1, wherein the first stage comprises a first transistor, wherein one of:
    a) the first transistor is a field effect transistor and a source of the transistor is connected to the input node and a gate of the transistor is arranged to receive a first transistor control voltage, and
    b) the first transistor is a bipolar transistor and an emitter of the transistor is connected to the input node and a base of the transistor is arranged to receive a first transistor control voltage.

3. A voltage controlled current path as claimed in claim 1, wherein the current flowing in the first transistor is amplified by the at least one current mirror, and the at least one current mirror is connected to a protected node.

4. A voltage controlled current path as claimed in claim 1, further comprising an input circuit wherein a trigger voltage for initiating current flow is modified when current flow has started so as to provide hysteresis.

5. A voltage controlled current path as claimed in claim 1, wherein one or more of the at least one current mirror comprises a plurality of transistors, and
    wherein one or more of the transistors are capable of being inhibited from passing current so as to vary a current gain of the current mirror.

6. A voltage controlled current path as claimed in claim 1, in which the first stage comprises a plurality of input transistors, each input transistor of the plurality of input transistors configured to receive a respective trigger voltage.

7. A voltage clamp for limiting voltage excursions at a protected node, the voltage clamp comprising:
    a voltage controlled current path that includes:
    a first stage arranged to conduct current once the voltage at an input node of the first stage exceeds a threshold value, wherein the amount of current is a first function of the voltage at the input node, and a second stage arranged to pass a current as a second function of the current through the first stage, the voltage controlled current path connected to the protected node;
    wherein the second stage includes at least one current mirror having a sense transistor and a mirror transistor; and
    wherein the second function is substantially linear via a ratio of a width of the sense transistor and a width of the mirror transistor.

8. A voltage clamp as claimed in claim 7, further comprising a signal input node and a non-zero impedance operably connected between the signal input node and the protected node.

9. A voltage clamp as claimed in claim 7, in which the input node of the first stage and the protected node are directly connected together.

10. A voltage clamp as claimed in claim 7, in which the input node of the first stage and the protected node are operably connected together by an intervening component.

11. A voltage clamp as claimed in claim 7, in which the voltage clamp is arranged to protect the protected node from overvoltage excursions in excess of a first protection voltage.

12. A voltage clamp as claimed in claim 7, further including a second current flow path for protecting the protected node from under voltage excursions wherein the voltage drops more negative than a second protection voltage.

13. A system, comprising:
    an analog to digital converter; and
    a voltage clamp in combination with the analog to digital converter, the voltage clamp limiting voltage excursions at a protected node and including a voltage controlled current path that includes:
    a first stage arranged to conduct current once the voltage at an input node of the first stage exceeds a threshold value, wherein the amount of current is a first function of the voltage at the input node, and a second stage arranged to pass a current as a second function of the current through the first stage, the voltage controlled current path connected to the protected node;
    wherein the second stage includes at least one current mirror having a sense transistor and a mirror transistor; and wherein the second function is substantially linear via a ratio of a width of the sense transistor and a width of the mirror transistor.

14. A voltage controlled current path, comprising:
a first stage arranged to conduct current once the voltage at an input node of the first stage exceeds a threshold value, wherein the amount of current is a first function of the voltage at the input node;
a second stage arranged to pass a current as a second function of the current through the first stage, the second stage including at least one current mirror; and
wherein one or more of the at least one current mirror comprises a plurality of transistors, wherein one or more of the transistors can be inhibited from passing current so as to vary a current gain of the current mirror.

15. The voltage controlled current path of claim 14, further comprising an input circuit wherein a trigger voltage for initiating current flow is modified once current flow has started so as to provide hysteresis.

16. The voltage controlled current path of claim 14, wherein the first stage includes a plurality of input transistors, each receiving a respective trigger voltage.

17. The voltage controlled current of claim 14, wherein the second stage includes at least one current mirror having a sense transistor and a mirror transistor; and
wherein the second function is substantially linear via a ratio of a width of the sense transistor and a width of the mirror transistor.

18. The voltage controlled current path of claim 1, wherein the mirror transistor includes multiple individual transistors and the width of the mirror transistor is a combined width of the multiple individual mirror transistors.

19. The voltage controlled current path of claim 18, including one or more switches configured to enable and disable current flow via the multiple individual transistors, wherein each switch of the one or more switches is coupled in a series connected configuration with a corresponding transistor of the multiple individual transistors.

20. The voltage controlled current path of claim 1, including a bleed resistor coupled to a control node common to the sense transistor and the mirror transistor.

21. The voltage controlled current path of claim 1, wherein the input node is configured to supply power to at least a portion of the second stage.

22. An integrated circuit die, comprising:
an analog to digital converter (ADC), having first components configured to tolerate voltages of a first voltage domain, and configured to receive an analog signal from a device operating in a second voltage domain, the second voltage domain extending beyond the first voltage domain;
a first electrostatic discharge (ESD) circuit to protect the first components; and
a protection circuit configured to limit voltage excursions at an input node of the ADC to protect the first components from exposure to voltages within the second voltage domain and outside the first voltage domain, and to prevent charge associated with the second voltage domain from being trapped in transistors of the ADC and disrupting operation of the ADC until the charge leaks away.

23. The integrated circuit die of claim 22, wherein a single die includes a second ESD circuit coupled between the input node and the protection circuit, wherein the second ESD circuit is configured to discharge energy associated with voltages beyond the second voltage domain.

24. The integrated circuit die of claim 22, wherein the protection circuit includes at least one current mirror configured conduct current when a voltage at an input node of the voltage clamp exceeds a threshold value.

25. The integrated circuit die of claim 22, wherein the voltage clamp includes:
a comparator configured to receive a threshold voltage, to compare a voltage at the input node to the threshold voltage, and to initiate diversion of first current from the input node when the voltage at the input node rises above the threshold voltage; and
a controllable current path configured to divert additional current from the input node, wherein the additional current is proportional to the first current.

26. The integrated circuit die of claim 25, wherein the comparator includes a transistor having a control node, the transistor configured to receive the threshold voltage at the control node.

27. The integrated circuit die of claim 22, including a second ESD circuit configured to couple the input node of the ADC with the voltage clamp.

28. An integrated circuit comprising:
an analog-to-digital converter (ADC) having first components configured to tolerate voltages of a first voltage domain, and configured to receive an analog signal from a device operating in a second voltage domain, the second voltage domain extending beyond the first voltage domain;
a first electrostatic discharge circuit configured to protect components of the ADC; and
means for preventing charge associated with the second voltage domain from being trapped in transistors of the ADC and disrupting operation of the ADC until the charge leaks away.

29. The integrated circuit of claim 28, wherein the ESD circuit is not configured to protect components of the means for preventing charge associated with the second voltage domain from being trapped in transistors of the ADC and disrupting operation of the ADC until the charge leaks away from electrostatic discharge.

30. The integrated circuit of claim 28, wherein the means for preventing charge associated with the second voltage domain from being trapped in transistors o the ADC and disrupting operation of the ADC until the charge leaks away includes:
a comparator configured to receive a threshold voltage, to compare a voltage at the input node to the threshold voltage, and to initiate diversion of first current from the input node when the voltage at the input node rises above the threshold voltage; and
a controllable current path configured to divert additional current from the input node, wherein the additional current is proportional to the first current.

31. The integrated circuit of claim 28, including a second ESD circuit configured to couple the input node of the ADC with the means for preventing charge associated with the second voltage domain from being trapped in transistors of the ADC and disrupting operation of the ADC until the charge leaks away.

* * * * *

UNITED STATES PATENT AND TRADEMARK OFFICE
CERTIFICATE OF CORRECTION

PATENT NO. : 10,110,206 B2
APPLICATION NO. : 14/713538
DATED : October 23, 2018
INVENTOR(S) : Hummerston et al.

Page 1 of 1

It is certified that error appears in the above-identified patent and that said Letters Patent is hereby corrected as shown below:

In the Claims

In Column 9, Line 23, in Claim 17, after "current", insert --path--

In Column 10, Line 46, in Claim 30, delete "o" and insert --of-- therefor

Signed and Sealed this
Twenty-fourth Day of March, 2020

Andrei Iancu
*Director of the United States Patent and Trademark Office*